United States Patent [19]

Vittoz

[11] 3,829,714

[45] Aug. 13, 1974

[54] FREQUENCY DIVIDING LOGIC STRUCTURE

[75] Inventor: Eric André Vittoz, Cernier, Switzerland

[73] Assignee: Centre Electronique Horloger S.A.

[22] Filed: June 6, 1972

[21] Appl. No.: 260,179

[30] Foreign Application Priority Data

June 7, 1971 Switzerland........................ 8248/71

[52] U.S. Cl............... 307/225 C, 307/215, 307/205

[51] Int. Cl. .......................................... H03k 21/06

[58] Field of Search........... 307/215, 220 R, 220 C, 307/225, 225 C, 205

[56] References Cited

UNITED STATES PATENTS 3,110,821 11/1963 Webb................................ 307/215

3,475,621 10/1969 Weinberger ........................ 307/215

3,501,701 3/1970 Reid.................................... 307/215

3,571,727 3/1971 Lombardi ....................... 307/215 X

*Primary Examiner*—John S. Heyman

*Attorney, Agent, or Firm*—Stevens, Davis, Miller & Mosher

[57] ABSTRACT

A frequency dividing logic structure comprises five logic operators, provided by AND-NOR elements formed by nineteen complementary MOST, connecting an input variable I to five output variables A, B, C, D and E in accordance with the following logical equations:

$A = \overline{EI}$ $B = \overline{D}$ $C = \overline{E}$ $D = \overline{A(B+I)}$ $E = \overline{AD + CI},$ or with the corresponding dual equations.

3 Claims, 6 Drawing Figures

OUTPUT: any of A, B, C, D or E

FREQUENCY DIVIDING LOGIC STRUCTURE

BACKGROUND OF THE INVENTION

The invention relates to frequency dividing logic structures, and is particularly concerned with such structures for dividing by two and which can be provided with MOS transistors using integrated-circuit techniques.

The use of purely logic frequency dividing circuits using elements operating with two states (called 0 and 1) has the advantage of compatability with integrated-circuit techniques.

The structure of a logic system can be completely defined by a certain number of logical equations involving logic variables.

A structure is arrived at by providing a logic element (gate) to carry out each equation and interconnecting the various elements according to the equations.

The simplest known structure for dividing by two is given by the following equations:

$$A = \overline{DI + CI}$$
$$B = \overline{DI + AI}$$
$$C = \overline{A} \qquad \text{(i)}$$
$$D = \overline{B}$$

where I is an input variable, and A, B, C or D can be chosen as the output variable. A structure carrying out equations (i) can be provided by "transmission gates" and inverters (negaters( (see 1967 ISSCC Digest, pp 52–53) or by AND–NOR elements with MOS-transistors (see IEEE Proceedings, Vol. 57, No. 9, Sept. 1969, pp 1,528–1,532 and U.S. Pat. No. 3,619,644 and No. 3,619,646).

This structure has the disadvantage of requiring the input variable in both its basic form (I) and its complement ($\overline{I}$). Moreover, and most important, it involves a so-called inherent risk or chance of error, namely that the circuit no longer divides if $\overline{I}$ is too delayed in relation to I, and the element carrying out equation A must be slowed down to compensate for this delay.

The simplest known dividing structure without such an error risk is defined by the equations:

$$A = \overline{B + E}$$
$$B = \overline{A + C + I}$$
$$C = \overline{D + I}$$
$$D = \overline{A + C} \qquad \text{(ii)}$$
$$E = \overline{B + F}$$
$$F = \overline{C + E}$$

where I is an input variable, and each of the six other variables may be chosen as the output variable. A structure carrying out equations (ii) consists of six NOR elements having a total of thirteen inputs (FAN-IN) connected is shown in FIG. 1 of the drawings. Provision of this structure with complementary MOST requires two MOST per FAN–IN, therefore twenty six MOST in all.

SUMMARY OF THE INVENTION

An object of the invention is to provide a simplified frequency dividing structure, i.e., involving a lesser number of components, which does not have an inherent error risk.

According to the invention, a frequency dividing logic structure comprises five logic operators connecting an input variable I to five output variables A, B, C, D and E in accordance with the following logical equations:

$$A = \overline{EI}$$
$$B = \overline{D}$$
$$C = \overline{E} \qquad \text{(iii)}$$
$$D = \overline{A(B + I)}$$
$$E = \overline{AD + CI},$$

or the corresponding dual equations obtained by exchanging the union (disjunction) operations (OR) and the meet (conjunction) operations (AND).

Since the structure according to the invention does not require the input variable in its two forms I and $\overline{I}$, it does not include the above-mentioned error risk. Moreover, as will be seen later, the structure can be provided with a total of nineteen MOST using known integrated-circuit techniques.

THEORETICAL EXPLANATION

FIG. 1 shows the prior art.

FIGS. 2 and 3 of the drawings are two explanatory diagrams for structures according to the invention.

The six variables of the above logical equations (iii) of the structure according to the invention enable $2^6 = 64$ different states to be defined. To facilitate the following explanation, each of these states will be coded by a decimal number obtained by associating a different binary weight with each variable, namely:

| variable | I | A | B | C | D | E |
|---|---|---|---|---|---|---|
| weight | 32 | 16 | 8 | 4 | 2 | 1 |

For example, the state $$I = 0$$
$$A = 1$$
$$B = 1$$
$$C = 0$$
$$D = 0$$
$$E = 1$$

is coded $0.32 + 1.16 + 1.8 + 0.4 + 0.2 + 1.1 = 25$.

An examination of the equations (iii) shows that they are simultaneously satisfied for the four following staes:

| Code | I | A | B | C | D | E |
|---|---|---|---|---|---|---|
| 25 | 0 | 1 | 1 | 0 | 0 | 1 |
| 35 | 1 | 0 | 0 | 0 | 1 | 1 |
| 22 | 0 | 1 | 0 | 1 | 1 | 0 |
| 60 | 1 | 1 | 1 | 1 | 0 | 0 |

These are the stable states of the structure.

If, starting from any one of these stable states, the input variable I is made to transit or switch, the system adopts a new state for which one of the equations is no longer satisfied, i.e., a transient state; the corresponding variable will then transit or switch to bring the system into a new state, and so on until a new stable state is reached.

These different transitions are represented by arrows in the diagram of FIG. 2, in which the stable states are indicated by circles in heavy lines surrounding the code numbers 22, 25, 35 and 60. It can be seen from the diagram that a series of transitions of the input variable I enables the stable states 25, 35, 22 and 60 to be cyclically repeated.

The evolution of the stable states of the six variables is represented in FIG. 3.

It can be seen from FIG. 3 that the frequency of the transitions of each of the variables A, B, C, D and E is a half that of the input variable I, i.e., such a structure divides by two.

An examination of FIG. 2 also shows that each transient state switches only to one single new state, which characterizes a system without an inherent error risk. On the other hand, a system with an error risk would include one or more transient states for which several equations would simultaneously not be satisfied. Several variables would thus tend to transit or switch, the subsequent state arrived at depending on the relative speed of transition of these variables.

DESCRIPTION OF PREFERRED EMBODIMENTS

FIGS. 4 and 5 of the accompanying drawings show, by way of example, circuit diagrams of two embodiments of structures according to the invention.

Figure 1:
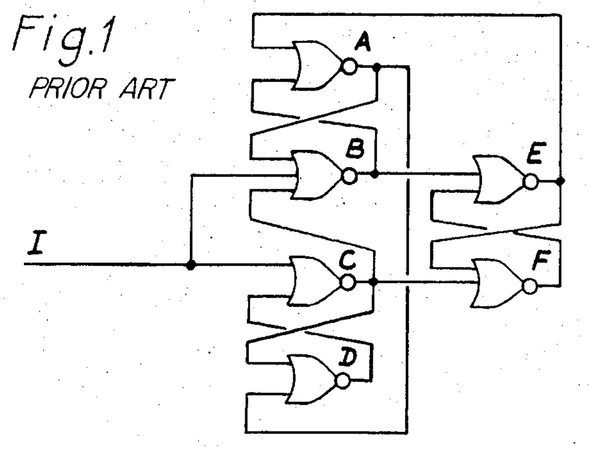
Fig.1 PRIOR ART
Figure 3:
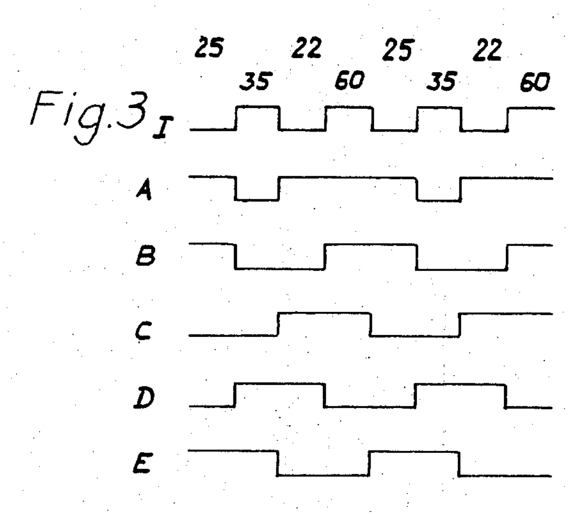
Figure 4:
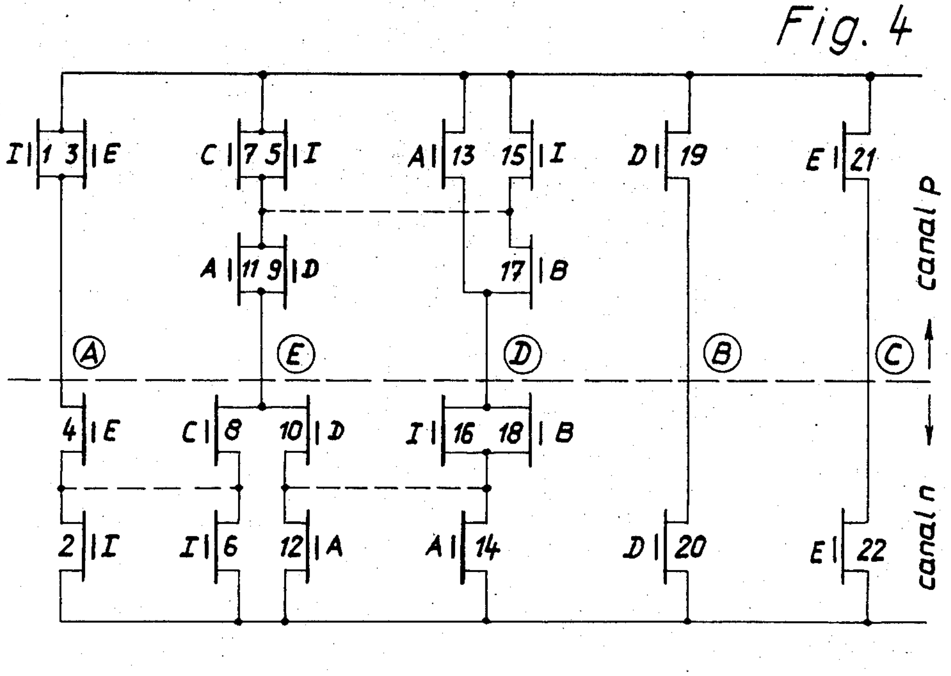
FIG. 4 shows a basic embodiment of the structure provided with AND–NOR elements with complementary MOST, for example.

The variables produced by the elements are encircled. To simplify the diagram, the elements that they control are marked with the same symbol.

It can be seen that this basic circuit comprises twenty two transistors in all, the p-type MOST bearing odd reference numerals and being situated in the upper part of the figure, while the n-type MOST bear even reference numerals and are situated in the lower part of the figure.

This circuit comprising twenty two transistors exactly carries out the set of logical equations (iii). This circuit can be simplified, i.e., include a lesser number of transistors, only if certain conditions are fulfilled. In effect, it is possible to electrically connect two points of the circuit (previously less directly connected without changing the operation. If such a connection operation places two transistors controlled by the same variable in parallel, one of these transistors becomes redundant and may be eliminated.

Figure 2:
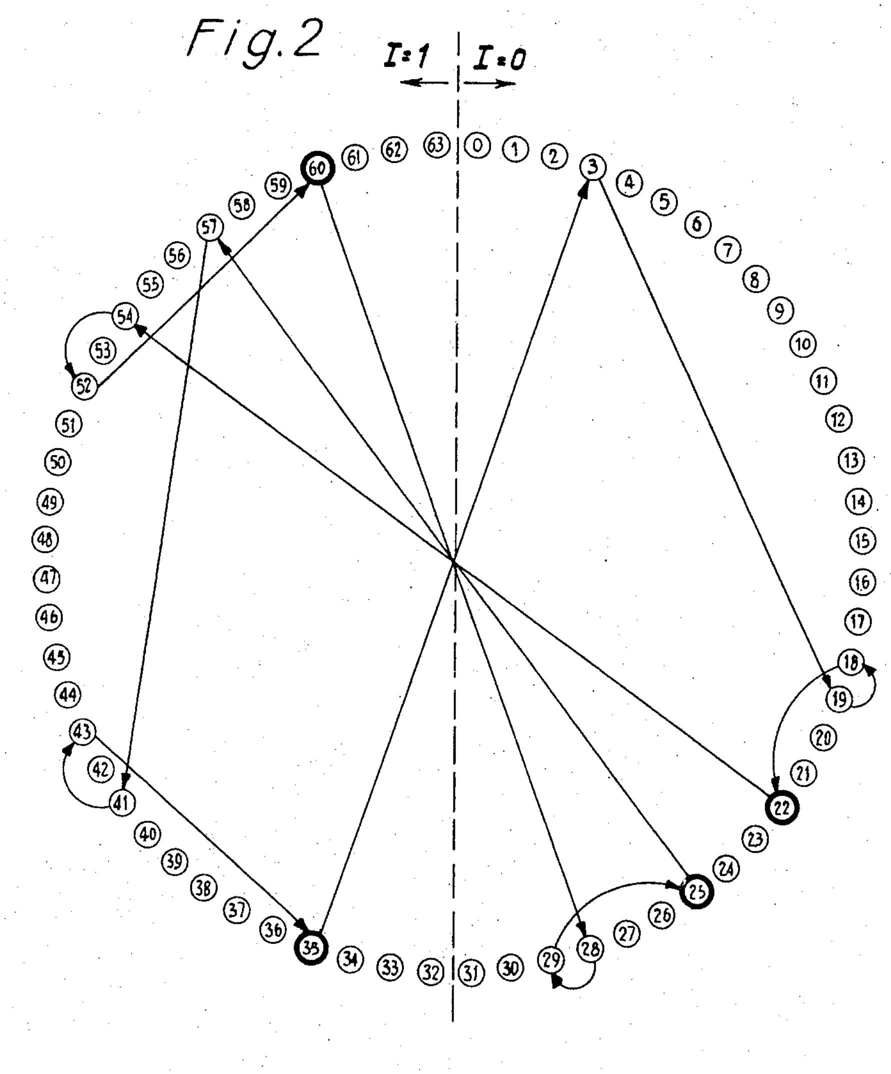

Consider, for example, the MOST 2 and 6 which have two common electrodes. Their third electrodes may be connected together, as indicated in dashed lines, only if the corresponding output variables A and E are not perturbed by a conducting path passing through the MOST 4 and 8. When MOST 2 and 6 are blocked, MOST 4 and 8 conduct, so that variables A and E must have the same value. Hence, the states for which $$I = 0$$
$$C = 1$$
$$E = 1$$
$$A = 0$$

i.e., the states 5, 7, 13 and 15, must never occur during the operational cycle, as can be verified by consulting FIG. 2. The three electrodes of the MOST 2 and 6 may thus be connected together two by two, which signifies that these two MOST can be contracted into a single one.

The same reasoning applies to MOST 12 and 14, which can thus be contracted into a single one, since the states 10, 14, 34, 38, 42 and 46, which would be perturbed by such a contraction, never occur during operation.

Concerning contraction of the MOST 5 and 15, the states 37, 38 and 33, which would be perturbed by connecting the MOST 17 and 9 or 11, do not occur. However, it is also necessary to verify that the MOST 7 connected in parallel to MOST 15 does not perturb the output D. When MOST 13 and 15 are blocked and 17 conducts, MOST 7 must not conduct. Therefore, the states for which $$I = 1$$
$$A = 1$$
$$B = 0$$
$$C = 0,$$

i.e., the states 48, 49, 50 and 51, must not occur during the operational cycle. FIG. 2 shows that is indeed the case, so that the MOST 5 and 15 can also be contracted into a single one.

Figure 5:
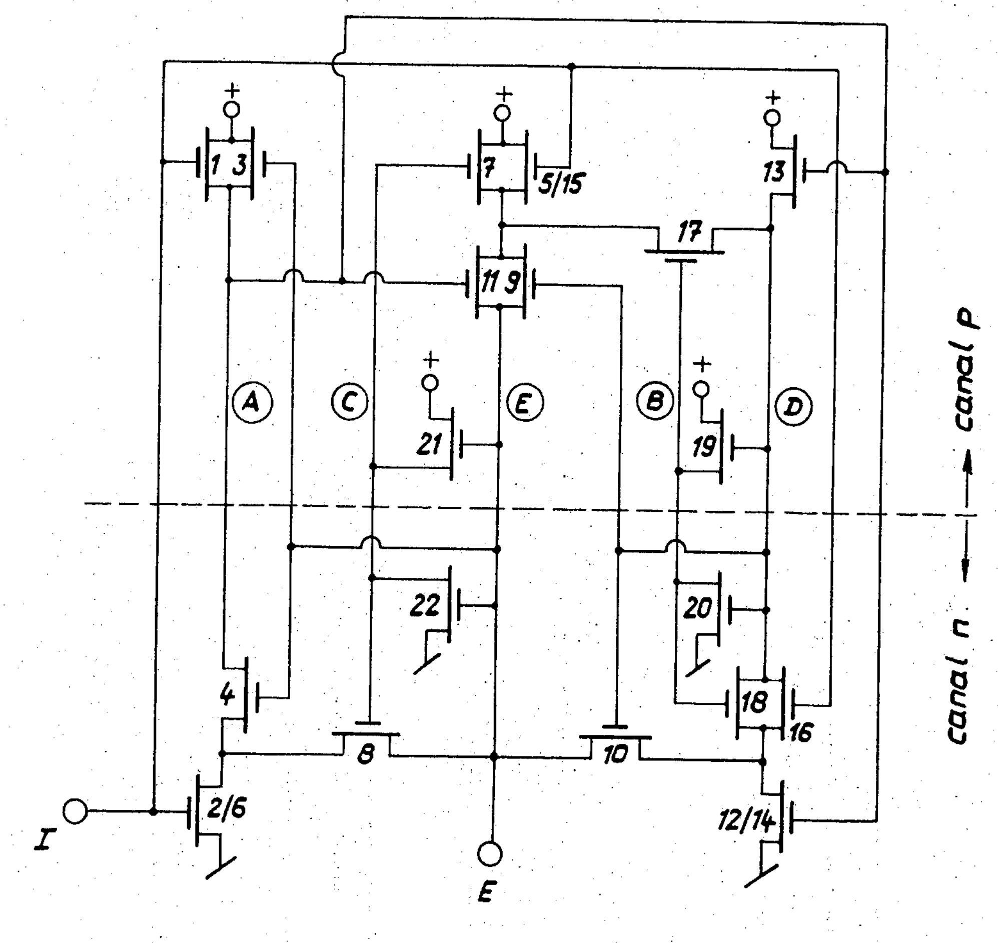

By effecting the above contractions, the circuit of FIG. 5 is obtained with a total of nineteen MOST, namely ten p-type transistors (designated by odd reference numerals) and nine n-type transistors (designated by even reference numerals). The sources of transistors 1, 3, 7, 5/15, 13 are connected to the positive pole of a battery; the sources of transistors 2/6. 12/14 are connected to the negative pole of the battery; and the gates of transistors 2/6, 1, 5/15 and 16 are connected in common to the input terminal of variable I. The drains of transistors 1, 3 and 4 are connected in common to the gates of transistors 11, 13 and 12/14 to form the connection of variable A; the drains of transistors 19 and 20 are connected to the gates of transistors 17 and 18 to form the variable B; the drains of transistors 21 and 22 are connected to the gates of transistors 7 and 8 to form the variable C; the drains of transistors 13, 17, 16 and 18 are connected to the gates of transistors 9, 10, 19 and 20 to form the variable D; and the drains of transistors 8, 9, 10 and 11 are connected to the gates of transistors 21 and 22 to form the variable E. The drains of transistors 17 and 5/15 are connected to the sources of transistors 9, 11 and 17; the drain of transistor 2/6 is connected to the sources of transistors 4 and 8; and the drain of transistor 12/14 is connected to the sources of transistors 10, 16 and 18.

This circuit has the advantage, characteristic of circuits with complementary MOST, of consuming no rest current. Only the transitions require a certain current, to charge the parasitic capacitances of the circuit.

It is clear that by taking only one half of the circuit (eighter only the p-type MOST, or only the n-type MOST), and by replacing the other half by ballast resistors connected to five nodes A, B, C, D and E, there is obtained a circuit carrying out the same operations, comprising a lesser number of MOST, but consuming a rest current.

It is also clear that by systematically replacing all of the p-type transistors by n-type transistors and vice-versa, there is obtained a circuit operating in the same manner and corresponding to a set of equations obtained by negating all of the variables, i.e., a dual set of equations obtained by exchanging the union or disjunction operations (OR) and the meet or conjunction operations (AND).

Figure 6:
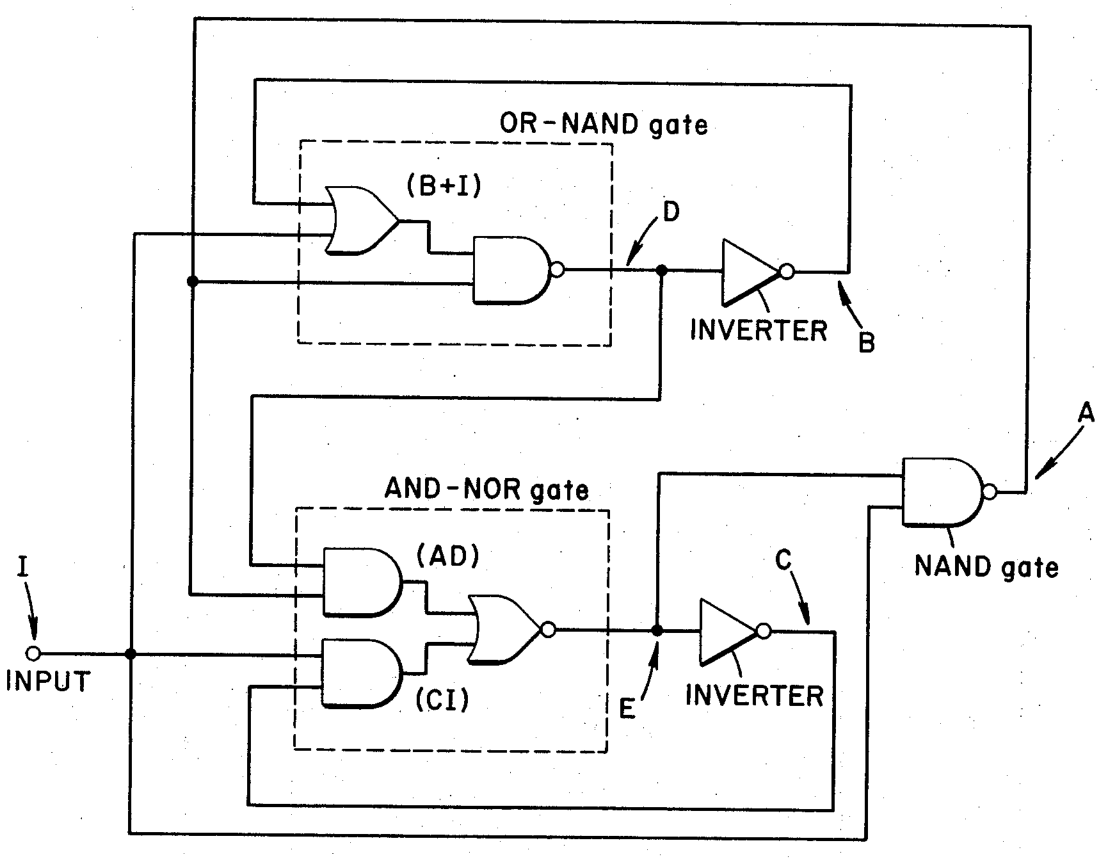
FIG. 6 is a schematic diagram of the structure of FIG. 5.

The circuit of FIG. 5 is seen schematically in FIG. 6 which shows the various MOST'S forming an OR-NAND gate, AND–NOR gate, NAND gate, and two inverters to achieve the logic indicated at the various output points.

What is claimed is:

1. Frequency dividing logic structure comprising five logic operators connecting an input variable I to five output variables A, B, C, D and E in accordance with the following logical equations:

$$A = \overline{EI}$$

$$B = \overline{D}$$

$$C = \overline{E}$$

$$D = \overline{A(B+I)}$$

$$E = \overline{AD + CI}$$

whereby the equation $A = \overline{EI}$ is effected by a NAND-gate, the equations $B = \overline{D}$ and $C = \overline{E}$ by two inverters, the equation $D = \overline{A(B+I)}$ by an OR-NAND-gate and the equation $E = \overline{AD + CI}$ by an AND-NOR-gate and wherein the NAND-gate has an output and two inputs, the two inverters each have an output and an input, the OR-NAND-gate has an output and three inputs, the AND-NOR-gate has an output and four inputs, and wherein I is connected to one input of the NAND-gate, one input of the AND-NOR-gate and one input of the OR-NAND-gate, and wherein the output of the NAND-gate is connected to a second input of the AND-NOR-gate and a second input of the OR-NAND-gate, and wherein the output of one inverter is connected to the third input of the OR-NAND-gate, and wherein the output of the other inverter is connected to the third input of the AND-NOR-gate, and wherein the output of the OR-NAND-gate is connected to the input of the one inverter and to the fourth input of the AND-NOR-gate, and wherein the output of the AND-NOR-gate is connected to the second input of the NAND-gate and to the input of the other inverter.

2. Frequency dividing logic structure comprising five logic operators connecting an input variable I to five output variables A, B, C, D and E in accordance with the following logical equations:

$$A = \overline{E+I}$$

$$B = \overline{D}$$

$$C = \overline{E}$$

$$D = \overline{A + BI}$$

$$E = \overline{(A+D)(C+I)}$$

whereby the equation $A = \overline{E+I}$ is effected by a NOR-gate, the equation $B = \overline{D}$ and $C = \overline{E}$ by inverters, the equation $D = \overline{A + BI}$ by an AND-NOR-gate and the equation $E = \overline{(A+D)(C+I)}$ by an OR-NAND-gate and wherein the NOR-gate has an output and two inputs, the two inverters each have an output and an input, the AND-NOR-gate has an output and three inputs, the OR-NAND-gate has an output and four inputs, and wherein I is connected to one input of the NOR-gate, one input of the OR-NAND-gate and one input of the AND-NOR-gate, and wherein the output of the NOR-gate is connected to a second input of the OR-NAND-gate and a second input of the AND-NOR-gate, and wherein the output of one inverter is connected to the third input of the AND-NOR-gate, and wherein the output of the other inverter is connected to the third input of the OR-NAND-gate, and wherein the output of the AND-NOR-gate is connected to the input of the one inverter and to the fourth input of the OR-NAND-gate, and wherein the output of the OR-NAND-gate is connected to the second input of the NOR-gate and to the input of the other inverter.

3. Frequency dividing logic according to claim 1 comprising ten p-type transistors and nine n-type transistors each having a source, a drain and a gate, said NAND-gate including first and second p-type transistors (1,3) and first and second N-type transistors (4,2/6), said one inverter including a third p-type transistor (19) and a third n-type transistor (20), said other inverter including a fourth p-type transistor (21) and a fourth n-type transistor (22), said OR-NAND-gate including fifth, sixth and seventh p-type transistors (5/15, 13, 17) and fifth, sixth and seventh n-type transistors (18, 16, 12/14), said AND-NOR-gate including eighth, ninth and tenth p-type transistors (7, 11, 9) as well as said fifth p-type transistor (5/15) and eighth and ninth n-type transistors (8, 10) as well as said second and seventh n-type transistors (2/6, 12/14), the sources of said first, second, third, fourth, fifth, sixth and eighth p-type transistors (1, 3, 19, 21, 5/15, 13, 7) being connected to the positive pole of a battery, the sources of said second, third, fourth and seventh n-type transistors (2/6, 20, 22, 12/14) being connected to the negative pole of the battery, the gates of said first and fifth p-type transistors (1, 5/15) and said second and sixth n-type transistors (2/6, 16) being connected to an input terminal for said input variable I, the drains of said first and second p-type transistors (1,3) and said first N-type transistor (4) being connected in common to the gates of said sixth and ninth p-type transistors (13, 11) and said seventh n-type transistor (12/14), the drains of said third p-type transistor (19) and said third n-type transistor (20) being connected to the gates of said seventh p-type transistor (17) and said fifth n-type transistor (18), the drains of said fourth p-type transistor (21) and said fourth n-type transistor (22) being connected to the gates of said eighth p-type transistor (7) and said eighth n-type transistor (8), the drains of said sixth and seventh p-type transistors (13, 17) and said fifth and sixth n-type transistors (18, 16) being connected to the gates of said third and tenth p-type transistors (19,9) and said third and ninth n-type transistors (20, 10), the drains of said ninth and tenth p-type transistors (11, 9) and said eighth and ninth n-type transistors (8, 10) being connected to the gates of the second and fourth p-type transistors (3, 21) and said first and fourth n-type transistors (4, 22), the drains of said fifth and eighth p-type transistors (7, 5/15) being connected to the sources of said seventh, ninth and tenth P-type transistors (17, 11, 9), the drain of said second n-type transistor (2/6) being connected to the sources of said first and eighth n-type transistors (4, 8), the drain of said seventh n-type transistor (12/14) being connected to the source of said fifth, sixth and tenth n-type transistors (18, 16, 10).

* * * * *